United States Patent [19]

Frommeld et al.

[11] Patent Number: 4,737,445
[45] Date of Patent: Apr. 12, 1988

[54] PHOTOPOLYMERIZABLE COMPOSITION AND PHOTOPOLYMERIZABLE RECORDING MATERIAL CONTAINING SAID COMPOSITION

[75] Inventors: Hans-Dieter Frommeld, Wiesbaden; Heike Ziemke, Budenheim, both of Fed. Rep. of Germany

[73] Assignee: Hoechst Aktiengesellschaft, Fed. Rep. of Germany

[21] Appl. No.: 921,119

[22] Filed: Oct. 21, 1986

[30] Foreign Application Priority Data

Oct. 21, 1985 [DE] Fed. Rep. of Germany ....... 3537380

[51] Int. Cl.$^4$ ................................................ G03C 1/68
[52] U.S. Cl. ..................... 430/281; 430/920; 522/63; 522/9; 522/16; 522/26
[58] Field of Search ................. 430/920, 281; 522/63, 522/9, 16, 26

[56] References Cited

U.S. PATENT DOCUMENTS 3,765,898 10/1973 Bauer et al. ...................... 430/920 X
4,272,609 6/1981 Kluepfel ............................. 430/288

FOREIGN PATENT DOCUMENTS 1345541 5/1974 United Kingdom .

OTHER PUBLICATIONS

Hackh's Chemical Dictionary, J. Grant, p. 643.
The Condensed Chemical Dictionary, 9th Edition, Van Nostrand Reinhold Company, pp. 74, 162, & 436.
Organic Chemistry, 2nd Edition, John Wiley & Sons, Inc., N.Y., pp. Contents viii.

*Primary Examiner*—Paul R. Michl
*Assistant Examiner*—Cynthia Hamilton
*Attorney, Agent, or Firm*—Schwartz, Jeffery, Schwaab, Mack, Blumenthal & Evans

[57] ABSTRACT

In photopolymerizable composition that contains, as the essential constituents,
(a) a polymeric binder,
(b) a polymerizable compound, and,
(c) as the photoinitiator, a 2,3-dihydro-1H-cyclopenta(b)quinoline represented the formula

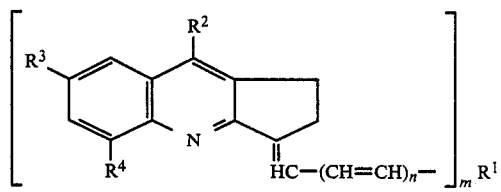

in which
$R^1$ is a substituted or unsubstituted m-valent, carbocyclic aromatic or heterocyclic aromatic radical,
$R^2$ is a hydrogen atom, an alkyl group, an aryl group, an aralkyl group or an aralkenyl group,
$R^3$ and $R^4$ are identical or different, and each denotes a hydrogen atom, a halogen atom, an alkyl group or an alkoxy group,
n is 0 or 1, and
m is 1 or 2,
the photoinitiator possesses an excellent initiating action, resulting in high image resolution.

11 Claims, No Drawings

PHOTOPOLYMERIZABLE COMPOSITION AND PHOTOPOLYMERIZABLE RECORDING MATERIAL CONTAINING SAID COMPOSITION

BACKGROUND OF THE INVENTION

The present invention relates to a photopolymerizable composition which contains, as essential constituents, (a) a polymeric binder, (b) a polymerizable compound having at least one terminal, ethylenically unsaturated double bond and a boiling point above 100° C. at standard pressure, and (c) a tricyclic N-heterocyclic compound as a photoinitiator.

In German Patent No. 20 27 467 (corresponding to British Patent. No. 1,354,541), photopolymerizable compositions are disclosed that comprise the above-mentioned constituents, but with specific derivatives of acridine and phenazine being used as the photoinitiators. Some representatives of this class of compounds are distinguished by a high photosensitivity. These preferred compounds have the disadvantage, however, of providing poor resolution of fine lines or screen dots.

German Patent No. 20 39 861 (corresponding to U.S. Pat. No. 3,765,898) discloses photopolymerizable compositions which contain derivatives of quinoxaline and quinazoline as photoinitiators. In the preferred compositions, these photoinitiator compounds yield only relatively low photosensitives.

European Patent No. 11 786 (corresponding to U.S. Pat. No. 3,272,609) discloses similar compositions containing quinoline derivatives as initiators. But the suitability of these compounds is not optimal, both as to image reproduction and to photosensitivity.

SUMMARY OF THE INVENTION

It is therefore an object of the present invention to provide photopolymerizable compositions that possess high photosensitivities and give excellent image reproduction.

In accomplishing this object, there has been provided, in accordance with one aspect of the present invention, a photopolymerizable composition that contains (a) a polymeric binder, (b) a poloymerizable compound having at least one terminal, ethylenically unsaturated double bond and a boiling point above 100° C. at standard pressure, and (c) a tricyclic N-heterocyclic compound as a photoinitiator, wherein said N-heterocylic compound is a 2,3-dihydro-1H-cyclopenta (b) quinoline represented by the formula

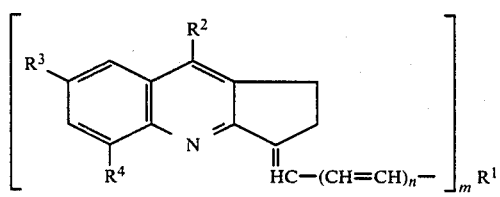

in which $R^1$ is a substituted or unsubstituted m-valent, carbocyclic aromatic or heterocyclic aromatic radical, $R^2$ is a hydrogen atom, an alkyl group, an aryl group, an aralkyl group or an aralkenyl group, $R^3$ and $R^4$ are identical or different, and each denotes a hydrogen atom, a halogen atom, an alkyl group or an alkoxy group, n is 0 or 1, and m is 1 or 2.

In accordance with another aspect of the present invention, a photopolymerizable recording material has been provided that comprises a layer support to which is applied a photopolymerizable layer comprised of the above-described composition.

Other objects, features and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The photoinitiators contained in the composition of the present invention absorb light in the spectral range from about 250 to about 450 nm. When irradiated in this spectral range, they function as active radical starters of the photopolymerization of vinyl compounds, even in the presence of oxygen. In addition, the novel photoinitiators of the present invention prevent thermal polymerization of such compounds when there is no actinic radiation. Thus, they are highly suitable for the preparation of storable photopoloymerizable compositions. Moreover, the compositions prepared employing the photoinitiators of the present invention are distinguished by good reproduction of fine details.

Suitable substituents on the aromatic radical $R^1$ include, inter alia, alkyl, aryl, aralkyl, alkoxy, alkylenedioxy, aryloxy, acyl, acyloxy, acylamino, aminocarbonyl, arylamino, alkylmercapto, arylmercapto, dialkylamino, cyano and hydroxy groups and halogen atoms. Of these, the aliphatic substituents generally have 1 to 6, preferably 1 to 3, carbon atoms, whereas substituents containing aromatic radicals generally have 6 to 10 carbon atoms. Preference is given to alkyl, alkoxy, alkylenedioxy, acyloxy, aryl and cyanide groups, and to halogen atoms.

The aromatic radical $R^1$ can be a carbocyclic or heterocyclic, preferably a carbocyclic, mono- or polynuclear aromatic radical which can also contain fused hydrogenated rings. In general, $R^1$ does not contain more than three rings, and one ring is preferred. Examples of basic groups suitable for the $R^1$ radicals are phenyl, naphtyl, anthryl, phenanthryl, acenaphthenyl, pyridyl, thienyl, benzothienyl, quinolyl, furyl, fluorenyl, benzanthryl, carbazolyl and phenazinyl groups. These groups can themselves be substituted.

Examples of suitable $R^2$ radicals are methyl, propyl, isobutyl, n-hexyl, phenyl, tolyl, anisyl, chlorophenyl, styryl and benzyl radicals.

$R^3$ and $R^4$ can be, for example, fluorine, chlorine, bromine and iodine atoms, and methyl, isopropyl, isoamyl, ethoxy, butoxy and ethoxyethoxy groups.

Compounds of formula I in which $R^1$ denotes phenyl, chlorophenyl or tolyl, $R^2$ denotes methyl, phenyl or styryl, and $R^3$ and $R^4$ denote hydrogen, chlorine or bromine have proved to be particularly effective in the context of the present invention.

The initiators of the present invention are usually employed in a concentration of 0.01 to 10% by weight, preferably of 0.2 to 4% by weight, based on the weight of the nonvolatile constituents of the composition.

Two of the compounds which are used as photoinitiators within the scope of this invention are known from literature [*J. Chem. Soc.* (1959): 1680 (Compound no. 1) and *Chem Ber.* 97: 16 (1964) (Compound no. 2)].

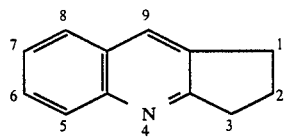

Polymerizable compounds which can be useful in the present invention are known and include, for example, compounds described in U.S. Pat. Nos. 2,760,863 and 3,060,023. Preferred examples of polymerizable compounds are acrylic and methacrylic acid esters of dihydric or polyhdric alcohols, such as ethylene glycol diacrylate, polyethylene glycol dimethacrylate, and acrylates and methacrylates of trimethylol ethane, trimethylol propane, pentaerythritol, dipentaerythritol and polyhydric alicyclic alcohols. Reaction products of diisocyanates with partial esters of polyhydric alcohols are also used to advantage. Monomers of this kind are described in German Offenlegungsschriften Nos. 20 64 079, 23 61 041 and 28 22 190. The proportion of monomers contained in a photopolymerizable layer within the present invention generally varies between 10 and 80% by weight, preferably between 20 and 60% by weight.

A great number of soluble organic polymers can be employed as binders. Examples include polyamides, polyvinyl esters, polyvinyl acetals, polyvinyl ethers, epoxide resins, polyacrylic acid esters, polymethacrylic acid esters, polyesters, alkyd resins, polyacrylamide, polyvinyl alcohol, polyethylene oxide, polydimethyl acrylamide, polyvinyl pyrrolidone, polyvinylmethyl formamide, polyvinylmethyl acetamide, and copolymers of the monomers that form the aforesaid homopolymers. Other suitable binders are natural substances and modified natural substances, for example, gelatin and cellulose ethers.

Binders that are used to particular advantage are insoluble in water but are soluble, or at least swellable, in aqueous-alkaline solutions, since layers containing such binders can be developed with the preferably employed aqueous-alkaline developers. Binders of this type can contain, for example, the following groups: —COOH, —PO$_3$H$_2$, —SO$_3$H, —SO$_2$NH, —SO$_2$—N-H—SO$_2$—, and —SO$_2$—NH—CO. Examples of these binders include maleate resins, polymers of β-methacryloyloxy-ethyl-N-(p-tolylsulfonyl) carbamate and copolymers of these and similar monomers with other monomers, and also vinyl acetate/crotonic acid copolymers and styrene/maleic acid anhydride copolymers. Preferably used are copolymers of alkylmethacrylates and methacrylic acid and copolymers of methacrylic acid, higher alkylmethacrylates and methyl methacrylates and/or styrene, acrylonitrile and the like, as described in German Offenlegungsschriften Nos. 20 64 080 and 23 63 806.

In general, the added quantity of binder amounts to 20 to 90% by weight, preferably 40 to 80% by weight, of the layer constituents.

Depending on their intended use and desired properties, the photopolymerizable compositions can contain various additional substances. Examples of these admixtures are:

inhibitors to prevent thermal polymerization of the monomers, hydrogen donors, substances regulating the sensitometric properties of layers of this type, dyes, colored and uncolored pigments, color precursors, indicators, and plasticizers, such as polyglycols or esters of p-hydroxyl-benzoic acid.

These constituents are preferably selected to minimize absorption in the region of actinic radiation, which is important for the initiation process.

For the purposes of the present description, actinic radiation is to be understood as any radiation, the energy of which corresponds at least to that of shortwave visible light. Longwave UV-radiation, as well as electron emission, X-rays and laser radiation, are suitable.

The photopolymerizable composition of the present invention can be used in many fields of application, such as in the production of safety glass; in varnishes which are hardened by the action of light or other radiation, such as electron beams; in dental fillings and, particularly, in producing light-sensitive copying material in the field of reproduction. Examples of applications in this last field include recording layers for the photomechanical production of printing plates suitable for relief printing, lithographic printing, gravure printing and screen printing; relief copies, for example, in the production of Braille books; single copies; tanned images; pigment images and the like. The compositions of the present invention can also be employed for the photomechanical production of etch resists, for example, for name plates, printed circuits, and chemical milling. The compositions of this invention are of particular importance with regard to the photomechanical production of lithographic printing plates and to photoresist technology.

The compositions of the present invention can be used industrially for the above-mentioned applications in the form of a liquid solution or dispersion, for example, a photoresist solution, which is applied by the consumer to an appropriate support, for example, for chemical milling and for the production of printed circuits, screen printing stencils, etc. The inventive composition can also be present as a solid light-sensitive layer on a suitable support, i.e., as a storable, presensitized copying material, for example, to be used in the production of printing plates. It can also be employed for the production of dry resists.

It is generally advantageous substantially to isolate the compositions of the present invention from the influence of atmospheric oxygen during light polymerization. If such a composition is used in the form of thin copying layers, it is recommended to apply a suitable cover film which has a low permeability to oxygen. The cover film can be self-supporting and can be removed from the copying layer prior to development. Polyester films, for example, are suitable for this purpose. The cover film can also be formed from a material that dissolves in the developer liquid or that can be removed at least from the non-hardened areas during development. Examples of materials suitable for this purpose are, inter alia, waxes, polyvinyl alcohol, polyphosphates and sugars.

Layer supports which are suitable for copying materials prepared using the composition of the present invention include, for example, aluminum, steel, zinc, copper, plastic films, such as films of polyethylene terephthalate and cellulose acetate, and screen printing supports, such as perlon gauze.

The light-sensitive materials employing the compositions of the present invention are conventionally prepared. Thus, the composition can be taken up in a solvent, and the resulting solution or dispersion can be applied to the intended support as a thin film by casting, spraying, immersion or roller application and subsequently dried. Thick layers (for example, 250 μm and thicker) are advantageously prepared by first producing a self-supporting film by extrusion or molding, which is then optionally laminated to the support. In the case of dry resists, solutions of the composition are applied to transparent intermediate supports and dried. The light-sensitive layers, having a thickness between about 10 and 100 μm, are then also bonded to the desired support by lamination, along with the temporary support.

The copying materials of the present invention can be processed using known methods. They are developed by treatment with an appropriate developer solution, preferably a weakly alkaline aqueous solution, whereby the unexposed areas of the layer are dissolved away and the exposed areas of the copying layer remain on the support.

The following examples are illustrative of photopolymerizable compositions within the present invention. First, the production of a compound of formula I is described. A number of other photoinitiators which may be contained in the composition according to the present invention are enumerated in Table I.

In the examples, parts by weight (p.b.w.) and parts by volume (p.b.v.) are related as g:cm$^3$. Unless otherwise indicated, percentages and quantitative ratios are to be understood as denoting units by weight.

PREPARATION EXAMPLE 10.8 g (80 mmol) of 2-aminoaceto-phenone, 7.1 g (84 mmol) of cyclopentanone, 40 g of glacial acetic acid and 0.2 g of concentrated sulfuric acid were heated to the boil and refluxed for 3 hours. Then 16.4 g (90 mmol) of 3,4-dichlorobenzaldehyde were added and the mixture was heated to the boil for another 3 hours. Upon cooling down, the product crystallized out in its pure form. Recrystallization from ethyl acetate, to which some drops of ammonia had been added, gave 22.0 g (81% of theory) of 3-(3,4-dichlorobenzylidene)-9-methyl-2,3-dihydro-1H-cyclopenta (b) quinoline (melting point: 187°–188° C.).

The compounds listed in Table I below were obtained by analogous procedures, whereby quantitive yields were achieved in some cases. The compounds listed in Table I are examples of photoinitiators, with structures corresponding to formula I, that can be contained in the compositions according to the present invention.

TABLE I

| Compound No. | R$^1$ | R$^2$ | R$^3$ | R$^4$ | n | m | Melting Point (°C.) |
|---|---|---|---|---|---|---|---|
| 1 | phenyl | H | H | H | 0 | 1 | 120 |
| 2 | " | CH$_3$ | H | H | 0 | 1 | 167 |
| 3 | " | CH$_3$ | H | H | 1 | 1 | 173 |
| 4 | " | C$_6$H$_5$ | H | H | 0 | 1 | 196 |
| 5 | " | " | Cl | H | 0 | 1 | 263 |
| 6 | " | " | H | H | 1 | 1 | 194 |
| 7 | " | " | Cl | H | 1 | 1 | 193 |
| 8 | 4-methoxy-phenyl | " | H | H | 0 | 1 | 192 |
| 9 | " | " | Cl | H | 0 | 1 | 210 |
| 10 | 4-ethoxy-phenyl | " | H | H | 0 | 1 | 202 |
| 11 | 3,4-dimethoxy-phenyl | " | H | H | 0 | 1 | 118 |
| 12 | 3,4-methylene dioxyphenyl | " | H | H | 0 | 1 | 239 |
| 13 | 4-acetyloxy phenyl | " | H | H | 0 | 1 | 228 |
| 14 | 4-chlorophenyl | " | H | H | 0 | 1 | 163 |
| 15 | 4-bromophenyl | " | Cl | H | 0 | 1 | 100 |
| 16 | 3,4-dichloro-phenyl | " | H | H | 0 | 1 | 212 |
| 17 | diphenyl-4-yl | " | H | H | 0 | 1 | 215 |
| 18 | 4-diethylamino | " | H | H | 0 | 1 | 183 |
| 19 | 4-cyano-phenyl | C$_6$H$_5$ | H | H | 0 | 1 | 248 |
| 20 | naphth-1-yl | " | H | H | 0 | 1 | 201 |
| 21 | 4-ethoxy-naphth-1-yl | " | H | H | 0 | 1 | 204 |
| 22 | anthrac-9-yl | " | H | H | 0 | 1 | 281 |
| 23 | pyrid-3-yl | " | H | H | 0 | 1 | 205 |
| 24 | furan-2-yl | " | H | H | 0 | 1 | 143 |
| 25 | thien-2-yl | " | H | H | 0 | 1 | 200 |
| 26 | phenyl | " | Br | H | 0 | 1 | 271 |
| 27 | " | " | Br | H | 1 | 1 | 207 |
| 28 | " | " | Cl | Br | 1 | 1 | 223 |
| 29 | " | Styryl | H | H | 0 | 1 | 204 |
| 30 | 1,4-phenylene | C$_6$H$_5$ | H | H | 0 | 2 | over 300 |
| 31 | diphenylether-4,4'-diyl | " | H | H | 0 | 2 | over 300 |
| 32 | 4-methyl-phenyl | " | H | H | 0 | 1 | 172 |
| 33 | " | " | Cl | H | 0 | 1 | 233 |

EXAMPLE 1

Twelve solutions, each of which was comprised of
25 p.b.w. of a terpolymer obtained from styrene, n-hexylmethacrylate and methacrylic acid (10:60:30) and having an acid number of 190,
25 p.b.w. of trimethylol-propane triacrylate,
50 p.b.w. of butanone,
250 p.b.w. of propylene glycol monomethyl ether,
0.5 p.b.w. of a blue azo dyestuff obtained by coupling 2,4-dinitro-6-chlorobenzene diazonium salt and 2-methoxy-5-acetylamino-N-cyanoethyl-N-hydroxyethyl-aniline, and
one of the photoinitiators enumerated below, in an amount corresponding to 10$^{-3}$ times its molecular weight:

(1a) 9-p-tolylacridine (1i—German Patentschrift No. 20 27 467)

(1b) 9-acetylaminoacridine (1e—German Patentschrift No. 20 27 467)

(1c) 6-methoxy-2,3-diphenyl quinoxaline (2m—German Patentschrift No. 20 39 861)

(1d) 2,3-di (p-methoxyphenyl) quinoxaline (2n—German Patentschrift No. 20 39 861)

(1e) 6-methoxy-2,3-di (p-methyoxy-phenyl)quinoxaline (2s—German Patentschrift No. 20 39 861)

(1f) 2-p-chlorostyryl-quinoline (7—Eur. App. No. 11 786)

(1g) cinnamylidene-quinaldine (8—Eur. App. No. 11 786)

(1h) 3-(3,4-dichlorobenzylidene)9-methyl-2,3-dihydro-1H-cyclopenta (b) quinoline (Preparation Example)

(1i) 3-benzylidene-9-methyl-2,3-dihydro-1H-cyclopenta(b) quinoline (Compound No. 2)

(1k) 3-cinnamylidene-9-methyl-2,3-dihydro-1H-cyclopenta(b) quinoline (Compound No. 3)

(1l) 3-(4-acetyloxy-benzylidene)-9-phenyl-2,3-dihydro-1H-cylopenta(b) quinoline (Compound No. 13)

(1m) 3-cinnamylidene-9-phenyl-2,3-dihydro-1H-cyclopenta(b) quinoline (Compound No. 6), were spin-coated, respectively, onto electrolytically grained and anodically oxidized aluminum and dried at 100° C. for 2 minutes, such that a layer weight of 4.6 g/m² was obtained in each case.

Thereafter, the coated photosensitive plates were provided with a coating of a 15% strength aqueous solution of polyvinyl alcohol (12% residual acetal groups, K-value 4) and dried again (coating weight 4-5 g/m²).

The printing plates thus obtained were exposed through a test original, by means of a gallium-doped metal halide lamp arranged at a distance of 110 cm, the test original comprising 1. a 13-step continuous tone exposure wedge having density increments of 0.15;
2. a halftone step wedge having 60 lines/cm;
3. a line test pattern of fine lines to test the image resolution.

Exposure of the various printing plates was performed such that in each case a solid step 4 of the continuous tone exposure wedge (corresponding to exposure through a grey field having an optical density of 0.65) was obtained after 2 minutes' development with a solution of the following composition:

15 p.b.w. of pelargonic acid,
10 p.b.w. of sodium hydroxide,
92 p.b.w. of a block polymer comprised of 90% of propylene oxide and 10% of ethylene oxide, and
12 p.b.w. of sodium tetrapolyphosphate, in
550 p.b.w. of water.

Under these conditions, step 8 (optical density 1.20) was completely clear after development. With the indicated optimum exposure, exposure time and photosensitivity bear a reciprocal relationship.

The resolution capacity was determined as follows: Using a magnifying glass, it was tested whether the screen dots of field 1 (4% dot—37 μm in size), of field 2 (8% dot—52 μm in size) or only of field 3 (14% dot—68 μm in size) were reproduced, i.e., were clearly visible following development. It was also tested whether lines having widths of 20 μm, or only lines having widths of 40 μm, were reproduced.

The test results are compiled in Table II below:

TABLE II

| Test No. | Exposure time (seconds) | Halftone wedge Reproduction of fields | | | Line original Reproduction of lines | |
|---|---|---|---|---|---|---|
| | | 1 | 2 | 3 | 20 μm | 40 μm |
| 1a | 10 | no | no | dot** | no | no |
| 1b | 15 | no | no | dot** | no | no |
| 1c | 40 | no | dot** | dot* | no | yes |
| 1d | 20 | no | no | dot* | no | no |
| 1e | 20 | no | no | dot* | no | no |
| 1f | 20 | no | dot* | good | no | yes |
| 1g | 15 | no | dot* | good | no | yes |
| 1h | 15 | good | good | good | yes | yes |
| 1i | 15 | good | good | good | yes | yes |
| 1k | 15 | good | good | good | yes | yes |
| 1l | 15 | good | good | good | yes | yes |

TABLE II-continued

| Test No. | Exposure time (seconds) | Halftone wedge Reproduction of fields | | | Line original Reproduction of lines | |
|---|---|---|---|---|---|---|
| | | 1 | 2 | 3 | 20 μm | 40 μm |
| 1m | 15 | good | good | good | yes | yes | dot* - dot gain
dot** - excessive dot gain

The table shows that some of the acridine derivatives possess a very high photosensitivity, but give images of unsatisfactory quality. The quinoxalines possess a lower photosensitivity, but otherwise show the same behavior as the acridine derivatives.

Likewise, the quinoline derivatives "f" and "g" are inferior to the compounds "h" to "m" of the present invention.

EXAMPLE 2

Nine solutions (2a to 2i), each comprising
17.6 p.b.w. of the reaction product of 1 mole of 2,2,4-trimethyl-hexamethylene diisocyanate of 2 moles of 2-hydroxyethyl methacrylate,
13.0 p.b.w. of a terpolymer of styrene, n-hexyl methacrylate and methacrylic acid (10:60:30) having an acid number of 190,
0.07 p.b.w. of the blue azo dyestuff described in Example 1, and
0.2 p.b.w. of one of the following photoinitiators:
(2a) 9-phenylacridine (1h—German Patentschrift No. 20 27 467)
(2b) 9-acetylaminoacridine (1e—German Patentschrift No. 20 27 467)
(2c) 2,3-di (p-methoxyphenyl) quinoxaline (2n—German Patentschrift No. 20 39 861)
(2d) 2,3-distyryl quinoxaline (1b—German Patentschrift No. 20 39 861)
(2e) 2-styryl quinoline (1 —Eur. App. No. 11 786)
(2f) cinnamylidene quinaldine (8 —Eur. App. No. 11 786)
(2g) 3-cinnamylidene-9-phenyl-2,3-dihydro-1H-cyclopenta (b) quinoline (Compound No. 6)
(2h) 3-cinnamylidene-9-methyl-2,3-dihydro-1H-cyclopenta (b) quinoline (Compound No. 3)
(2i) 3-benzylidene-9-phenyl-2,3-dihydro-1H-cyclopenta (b) quinoline (Compound No. 4), in
50 p.b.w. of butanone and
15 p.b.w. of ethanol, were applied to 25 μm-thick, polyethylene terephthalate film with subsequent drying at 100° C. in a drying cabinet for 2 minutes. Dry resist layers having a weight of 40 g/m² were obtained.

For protection from dust and mechanical damage, the dry resist layers were covered with a 20 μm-thick covering film of polyethylene, which adhered less strongly to the resist layer than did the polyester film. Dry resists which have been protected in this way can be stored over a prolonged period, provided that light is excluded.

After removal of the covering film, the dry resist layers were laminated, at a temperature of 120° C. and an advance speed of 1.5 m/min., to a precleaned copper foil bonded to a rigid epoxide/glass fiber laminate, using a commercially available laminator.

Samples 2a to 2i of the resist material laminated to the copper surface were then exposed through the support film, under a 13-step exposure wedge having density increments of 0.15, for a duration of 10, 20 and 40 seconds each. Exposure was performed with a 5 kW gallium-doped metal halide lamp. Wedge step 0 corresponds to an optical density of 0.05 (absorption of the film material).

The support film was peeled off, and the plates were subjected to spray development with 0.8% strength sodium carbonate solution at a temperature of 25° C. and for a duration of about 60 seconds. The fully crosslinked wedge steps on the dry resist layers, which were obtained in each case, were counted (the higher the number of crosslinked wedge steps, the higher the photosensitivity). The results thus obtained are compiled in Table III below:

TABLE III

| No. | Steps obtained by exposure for | | |
|---|---|---|---|
| | 10 sec. | 20 sec. | 40 sec. |
| 2a | 2 | 4 | 6 |
| 2b | 1 | 3 | 5 |
| 2c | 0 | 2 | 4 |
| 2d | — | 1 | 3 |
| 2e | — | 0 | 2 |
| 2f | 0 | 2 | 4 |
| 2e | 3 | 5 | 7 |
| 2h | 3 | 5 | 7 |
| 2i | 1 | 3 | 5 |

EXAMPLE 3

Four solutions, each comprised of 4.0 p.b.w. of a copolymer of methyl methacrylate and methacrylic acid (82:18), having an acid number of 110,
4.0 p.b.w. of trimethylolethane triacrylate,
0.04 p.b.w. of the blue azo dyestuff described in Example 1 and
0.07 p.b.w. of one of the following photoinitiators:
  (3a) 9-phenylacridine
  (3b) cinnamylidene quinaldine
  (3c) Compound No. 7
  (3d) Compound No. 14, in
38.00 p.b.w. of 2-ethoxy-ethanol and
18.00 p.b.w. of butyl acetate, were spin-coated onto electrolytically grained and anodically oxidized, 0.3 mm-thick aluminum, and were dried at 100° C. for two minutes, such that a layer weight of 2.4 g/m² was obtained in each case.

The coated photosensitive plates were thereafter coated with a 15% strength solution of polyvinyl alcohol (12% residual acetyl groups, K-value 4) and dried again (coating weight 4–5 g/m²).

The printing plates obtained in this way were exposed through a 13-step exposure test wedge having density increments of 0.15, by means of a 5 kW metal halide lamp arranged at a distance of 110 cm, the exposure being performed such that step 4 (exposure through a grey field having an optical density of 0.65) was fully reproduced during development with the following solution:
120 p.b.w. of sodium metasilicate×9 H₂O,
2.13 p.b.w. of strontium chloride,
1.2 p.b.w. of a non-ionogenic surfactant (coconut fatty alcohol polyoxyethylene ether having about 8 oxyethylene units),
0.12 p.b.w. of an anti-foam agent, and
4000.00 p.b.w. of fully deionized water.

TABLE IV

| Sample No. | Exposure time seconds | Resolution/image reproduction |
|---|---|---|
| 3a | 10 | bad, excessive dot gain in halftone fields |
| 3b | 60 | good |
| 3c | 40 | good |
| 3d | 40 | good |

It is true that, in these compositions, phenacridine possesses a considerably higher photosensitivity. But compared with the photoinitiators of the present invention, phenacridine nevertheless exhibits clear drawbacks.

EXAMPLE 4

Solutions were prepared, each comprising
13 p.b.w. of a copolymer of n-hexylmethacrylate and methacrylic acid (65:35)
6.4 p.b.w. of polyethylene glycol-400-dimethacrylate,
1.6 p.b.w. of an elastomeric polyaddition product of A and B, where
  A is the reaction product obtained from 21 p.b.w. of glycidyl methacrylate and 10.6 p.b.w. of adipic acid and
  B is the 145 p.b.w. of a diisocyanate having a molecular weight of 2,000, obtained from polybutane diol-(1,4) and tolylene diisocyanate (Adiprene® L 100),
0.2 p.b.w. of one of the photoinitiators listed in Table V, and
0.01 p.b.w. of the blue azo dyestuff described in Example 1, in
30.00 p.b.w. of butanone and
5.00 p.b.w. ethanol.

The solutions were coated, respectively, onto 25 μm-thick, polyethylene terephthalate film, dried (layer weight 35 g/m²) and then laminated onto rigid epoxide/glass fiber laminate clad with copper foil. The plates were exposed for 20 seconds through a test original representing a grey step wedge, using a commercially available exposure apparatus equipped with a 5 kW metal halide lamp, and were then developed for 60 seconds with 0.8% strength sodium carbonate solution. Table V below also shows the number of hardened wedge steps that were obtained in each case:

TABLE V

| Photoinitiator | Wedge steps |
|---|---|
| 5 | 5 |
| 7 | 7 |
| 8 | 6 |
| 13 | 6 |
| 16 | 6 |
| 17 | 5 |
| 19 | 5 |
| 20 | 5 |
| 24 | 7 |

EXAMPLE 5

A coating solution was prepared from
4 p.b.w. of a copolymer of methyl methacrylate and methacrylic acid (acid number 115)
4 p.b.w. of 1,1,1-trimethylolethane triacrylate,
0.1 p.b.w. of the blue azo dyestuff described in Example 1, and 0.1 p.b.w. of 3-(p-bromobenzylidene)-7-chloro-9-phenyl-2,3-dihydro-1H-cyclopenta(b) quinoline (Compound No. 15) in
52.0 p.b.w. of 2-methoxy-ethanol,
and was coated onto an electrolytically grained and anodically oxidized aluminum foil (dry layer weight 4 g/m$^2$) and then provided with a covering layer of polyvinyl alcohol (4g/m$^2$).

The printing plate thus obtained was exposed through an original for 30 seconds by means of a 5 kW metal halide lamp, and then was wiped for 1 minute with a developer of
15 p.b.w. of sodium metasilicate×9H$_2$O,
3 p.b.w. of polyglycol 6000.
0.6 p.b.w. of levulinic acid, and
0.3 p.b.w. of strontium hydroxide×8 H$_2$O, in
1000.0 p.b.w. of water,
whereby the unexposed portions of the layer were removed.

The plate was then inked with black greasy ink and subjected to a printing test in an offset machine. The test was stopped after 100,000 perfect prints had been run.

What is claimed is:

1. A photopolymerizable composition that contains
   (a) a polymeric binder;
   (b) a polymerizable compound having at least one terminal, ethylenically unsaturated double bond and a boiling point above 100° C. at standard pressure, and
   (c) a tricyclic N-heterocyclic photoinitiator compound, wherein said N-heterocyclic compound is a 2,3-dihydro-1H-cyclopenta (b) quinoline represented by the formula:

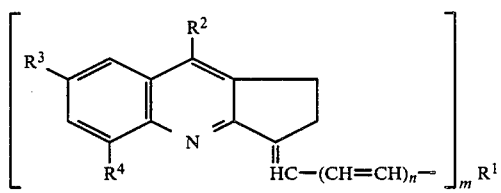

in which
   R$^1$ is a substituted or unsubstituted m-valent, carbocyclic aromatic or heterocyclic aromatic radical,
   R$^2$ is, an alkyl group, an aryl group, an aralkyl group or an aralkenyl group,
   R$^3$ and R$^4$ are identical or different, and each denotes a hydrogen atom, a halogen atom, an alkyl group or an alkoxy group,
   n is 0 or 1, and
   m is 1 or 2.

2. A photopolymerizable composition as claimed in claim 1, wherein R$^1$ is a substituted or unsubstituted phenyl group.

3. A photopolymerizable composition as claimed in claim 1, wherein R$^2$ is a methyl, a propyl, an isobutyl, a n-hexyl, a phenyl, a tolyl, an anisyl, a chlorophenyl, a styryl or a benzyl group.

4. A photopolymerizable composition as claimed in claim 1, wherein R$^3$ is a hydrogen, chlorine or bromine atom.

5. A photopolymerizable composition as claimed in claim 1, wherein said N-heterocyclic compound is present in an amount ranging between about 0.01 and 10 weight percent, based on the amount of non-volatile constituents of said composition.

6. A photopolymerizable composition as claimed in claim 1, wherein said polymerizable compound is an acrylic or methacrylic acid ester of a polyhydric aliphatic alcohol.

7. A photopolymerizable composition as claimed in claim 1, wherein said polymeric binder comprises a water-insoluble binder which is soluble in aqueousalkaline solutions.

8. A photopolymerizable recording material comprised of a layer support and a photopolymerizable layer applied thereto, which layer comprises:
   (a) a polymeric binder;
   (b) a polymerizable compound having at least one terminal, ethylenically unsaturated double bond and a boiling point above 100° C. at standard pressure, and
   (c) a tricyclic N-heterocyclic photoinitiator compound,
wherein said N-heterocyclic compound is a 2,3-dihydro-1H-cyclopenta(b)quinoline represented by the formula

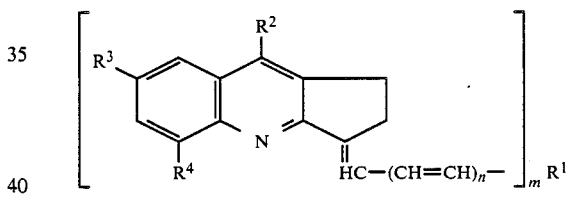

in which
   R$^1$ is a substituted or unsubstituted m-valent, carbocyclic aromatic or heterocyclic aromatic radical,
   R$^2$ is an alkyl group, an aryl group, an aralkyl group or an aralkenyl group,
   R$^3$ and R$^4$ are identical or different, and each denotes a hydrogen atom, a halogen atom, an alkyl group or an alkoxy group,
   n is 0 or 1, and
   m is 1 or 2.

9. A photopolymerizable recording material as claimed in claim 8, wherein R$^2$ is a methyl, a propyl, an isobutyl, a n-hexyl, a phenyl, a tolyl, an anisyl, a chlorophenyl, a styryl or a benzyl group.

10. A photopolymerizable recording material as claimed in claim 9, wherein R$^2$ is a methyl, phenyl or styryl group.

11. A photopolymerizable composition as claimed in claim 3, wherein R$^2$ is a methyl, phenyl or styryl group.

* * * * *